United States Patent
Hsing et al.

[11] Patent Number: 5,517,046
[45] Date of Patent: May 14, 1996

[54] HIGH VOLTAGE LATERAL DMOS DEVICE WITH ENHANCED DRIFT REGION

[75] Inventors: Michael R. Hsing, San Jose; Martin E. Garnett, Los Gatos; James C. Moyer, San Jose; Martin J. Alter, Los Altos; Helmuth R. Litfin, Cupertino, all of Calif.

[73] Assignee: Micrel, Incorporated, San Jose, Calif.

[21] Appl. No.: 384,168

[22] Filed: Feb. 6, 1995

Related U.S. Application Data

[60] Continuation-in-part of Ser. No. 313,471, Sep. 27, 1994, which is a division of Ser. No. 155,029, Nov. 19, 1993, Pat. No. 5,355,008.

[51] Int. Cl.$^6$ .................................................. H01L 29/78
[52] U.S. Cl. .......................... 257/336; 257/401; 257/492
[58] Field of Search ...................................... 257/336, 492, 257/401, 491

[56] References Cited

U.S. PATENT DOCUMENTS

| | | | |
|---|---|---|---|
| 4,922,327 | 5/1990 | Mena et al. | 257/336 |
| 5,355,008 | 10/1994 | Moyer et al. | 257/341 |
| 5,406,110 | 4/1995 | Kwon et al. | 257/492 |
| 5,412,239 | 5/1995 | Williams | 257/401 |

OTHER PUBLICATIONS

Taylor Efland, et al., "Optimized Complementary 40V Power LDMOS-FETs Use Existing Fabrication Steps In Submicron CMOS Technology," IEDM, Dec. 1994, pp. 399–402.

*Primary Examiner*—Jerome Jackson, Jr.
*Assistant Examiner*—Donald L. Monin, Jr.
*Attorney, Agent, or Firm*—Skjerven, Morrill, MacPherson, Franklin & Friel; Brian D. Ogonowsky

[57] ABSTRACT

A lateral DMOS transistor structure formed in N-type silicon is disclosed which incorporates a special N-type enhanced drift region. In one embodiment, a cellular transistor with a polysilicon gate mesh is formed over an N epitaxial layer with P body regions, P$^+$ body contact regions, N$^+$ source and drain regions, and N enhanced drift regions. The N enhanced drift regions are more highly doped than the epitaxial layer and extend between the drain regions and the gate. Metal strips are used to contact the rows of source and drain regions. The N enhanced drift regions serve to significantly reduce on-resistance without significantly reducing breakdown voltage.

20 Claims, 5 Drawing Sheets

HIGH VOLTAGE LATERAL DMOS DEVICE WITH ENHANCED DRIFT REGION

CROSS-REFERENCE TO RELATED APPLICATIONS

This application is a Continuation-in-Part of U.S. application Ser. No. 08/313,471, filed Sep. 27, 1994, which is a divisional of application Ser. No. 08/155,029, now Pat. No. 5,355,008, entitled "Diamond Shaped Gate Mesh for Cellular MOS Transistor Array," by James C. Moyer, Martin J. Alter, and Helmuth R. Litfin.

FIELD OF THE INVENTION

This invention relates to lateral double-diffused metal-oxide-semiconductor (LDMOS) transistors and, in particular, to an improved LDMOS transistor having a high breakdown voltage and a low on-resistance.

BACKGROUND OF THE INVENTION

Low on-resistance LDMOS transistors with high breakdown voltages are desirable for their low power loss in high voltage applications. It is well known in the art to increase breakdown voltage by increasing the distance between the drain region and the gate. However, increasing the distance between the drain region and the gate also undesirably increases the on-resistance of the LDMOS transistor.

FIG. 1 is a cross-sectional view of a conventional LDMOS transistor which serves to illustrate some of the causes of the increased on-resistance. In FIG. 1, a P substrate 10 has formed over it an $N^-$ epitaxial layer 11. On the surface of $N^-$ epitaxial layer 11 is formed an oxide layer 12, on which is formed a gate 13. In the surface of the $N^-$ epitaxial layer 11 are formed $N^+$ drain region 14 and P body region 15. $N^+$ source region 16 and $P^+$ body contact region 17 are formed in P body region 15. Source contact 18 contacts both $N^+$ source region 16 and $P^+$ body contact region 17. Drain contact 19 contacts $N^+$ drain region 14.

The distance between $N^+$ drain region 14 and gate 13 directly affects both on-resistance and breakdown voltage. Since the $N^-$ epitaxial layer 11 between the $N^+$ drain region 14 and the body region 15 (or gate 13) is only lightly doped, this layer 11 allows a relatively large depletion region to form between the regions 14 and 15 when the MOSFET is off, thus preventing a breakdown of the silicon between the regions 14 and 15. However, the $N^-$ epitaxial layer 11 presents a high resistance between the channel region and the drain region 14 when the MOSFET is turned on. Therefore, in the conventional LDMOS transistor, high breakdown voltage leads to high on-resistance.

What is needed is a novel LDMOS transistor which has a low on-resistance while exhibiting a high breakdown voltage.

SUMMARY

An LDMOS transistor is disclosed which incorporates an enhanced drift region. In one embodiment, the transistor is formed in an $N^-$ epitaxial layer with a polysilicon gate, $N^+$ source and drain regions, P body region, $P^+$ body contact region, and an N enhanced drift region. The N enhanced drift region extends between the $N^+$ drain region and the gate. The N enhanced drift region significantly lowers the on-resistance of the transistor, but surprisingly only slightly decreases the breakdown voltage, depending on the N enhanced drift region dose.

In an additional embodiment, the gate partially overlies a field oxide portion, which in turns overlies the enhanced drift region. The presence of the field oxide serves to significantly reduce the Miller capacitance of the transistor and further increases the breakdown voltage.

Another embodiment uses a cellular transistor structure and incorporates a polysilicon gate mesh with openings which can be of a variety of shapes, such as circles, hexagons, squares, diamonds, triangles, etc. The transistor is formed in an $N^-$ epitaxial layer with a polysilicon gate mesh, multiple $N^+$ source and drain regions, multiple P body regions, multiple $P^+$ body contact regions, and multiple N enhanced drift regions. Metal strips are used to contact the rows of source and drain regions.

DETAILED DESCRIPTION OF THE PREFERRED EMBODIMENTS

Figure 1:
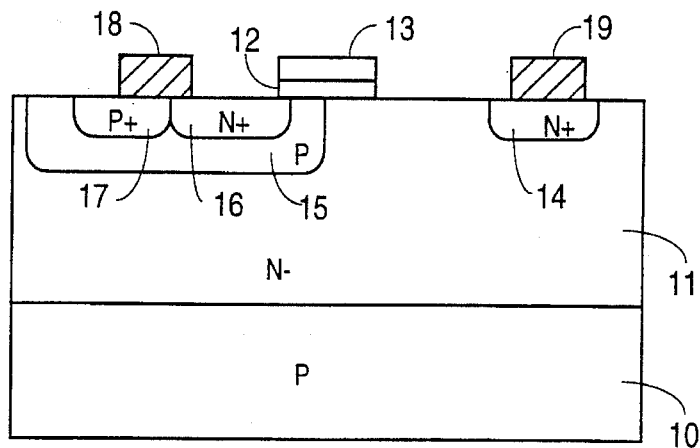
FIG. 1 is a cross-sectional view of a conventional LDMOS transistor.
Figure 2:
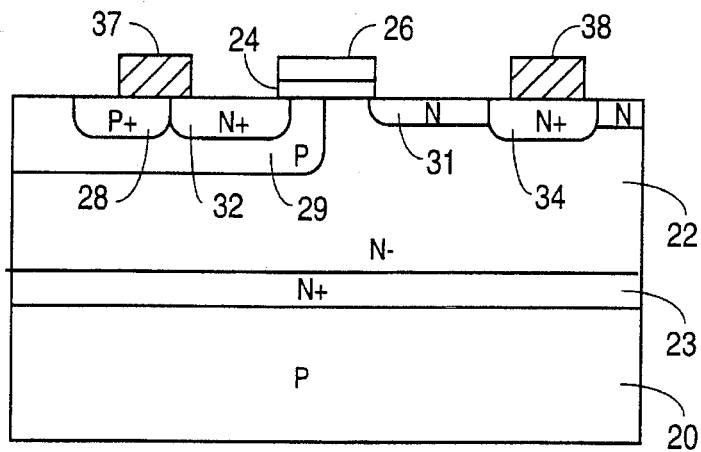
FIG. 2 is a cross-sectional view of an LDMOS transistor incorporating an enhanced drift region in accordance with one embodiment of the invention.

FIG. 2 illustrates the various regions and layers of one embodiment of a transistor in accordance with the invention. The starting substrate in one embodiment is a P-type silicon substrate 20 having a resistivity of approximately 6 ohms-cm. An $N^-$ epitaxial layer 22 approximately 10 microns thick is then grown on the surface of the substrate 20 using conventional techniques. In one embodiment, the resistivity of epitaxial layer 22 is approximately 0.8 ohms-cm. Instead of forming the transistor in an N- epitaxial layer, the transistor may instead be formed in an N-well formed in the P-type substrate 20.

In an alternative embodiment, the substrate 20 may be an N-type silicon substrate. In this alternative embodiment, an epitaxial layer may be eliminated and the transistors may be built directly in the substrate. In all embodiments described herein, the conductivity types may be reversed.

If desired, an N⁺ buried layer 23 may be formed at the interface of the N⁻ epitaxial layer 22 and substrate 20, using well known techniques, to reduce the beta of any parasitic PNP bipolar transistor formed.

A thin (e.g., 500 Angstroms) layer of gate oxide 24 is then grown on the surface of the N⁻ epitaxial layer 22.

A layer of polysilicon is then deposited on the surface of the gate oxide 24 to a thickness of approximately 5,000 Angstroms and then defined using conventional photolithographic and etching techniques to produce the polysilicon gate 26. The polysilicon may be predoped or doped in a later doping step to be made conductive. In the preferred embodiment, the polysilicon is doped heavily N-type.

Boron ions are then implanted to form the P⁻ type body 29. Drive-in of these ions may be performed next or in conjunction with later heating steps. In one embodiment, body 29 has an impurity concentration on the order of 1×E18 ions/cm³, but this concentration can vary considerably depending on the desired characteristics of the transistor. A P⁺ body contact 28 is then formed in the body 29 using ion implantation.

An N enhanced drift region 31 is then formed. The N enhanced drift region 31 substantially reduces on-resistance but surprisingly does not significantly decrease the breakdown voltage. In one embodiment to form region 31, phosphorus ions are implanted, self-aligned with gate 26, at an energy of 80 KeV and a dosage of 4–8E13/cm². Given this relatively low dosage, the phosphorus implant may be a blanket implant in certain embodiments. The dosage may even be as low as 5E11 for advantageous results to occur. The phosphorus ions are then driven in for 60 minutes at 1100° C. in a nitrogen atmosphere. The resulting depth of region 31 will be about 1.7 microns, and the surface concentration will be about 8E17 ions/cm³. The sheet resistance of the resulting region 31 is about 200 ohms/square. Increasing the phosphorus concentration will lower the on-resistance.

A second phosphorus or implantation process is then used to form the N⁺ source region 32 and N⁺ drain region 34.

Metal source contact 37 and drain contact 38 are then formed by conventional techniques.

Prior to the formation of the metal contacts, to optionally reduce the resistivity at the surface of the source region 32 and drain region 34, a layer of oxide (or other suitable material) may be deposited or grown over the surface of the wafer and then etched back to expose the surface of the source 32 and drain 34 regions while leaving a narrow oxide portion remaining around the gate 26 edges. A salicide (self-aligned silicide) is then formed on the exposed surfaces of these silicon regions by sputtering or evaporating a thin layer of a refractory metal (such as Mo, Ta, Ti, W) or a near-noble metal (Co, Ni, Pd, Pt) over the exposed silicon regions and then heating the wafer to react the metal with the silicon to form a salicide. The residual metal overlying any oxide is then rinsed away using conventional etching techniques. The resistivity of the salicide will be less than 5 ohms/square, while that of the underlying regions may be up to 100 ohms/square. Such a salicide forming process is well known and will not be discussed in detail. If desired, gate polycide may also be formed concurrently with the formation of the salicide.

Figure 3:
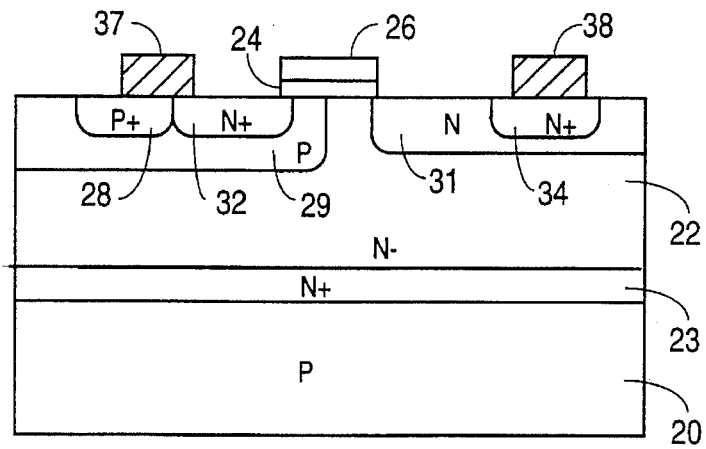
FIG. 3 is a cross-sectional view of an LDMOS transistor incorporating an alternative enhanced drift region in accordance with another embodiment of the invention.
Figure 4:
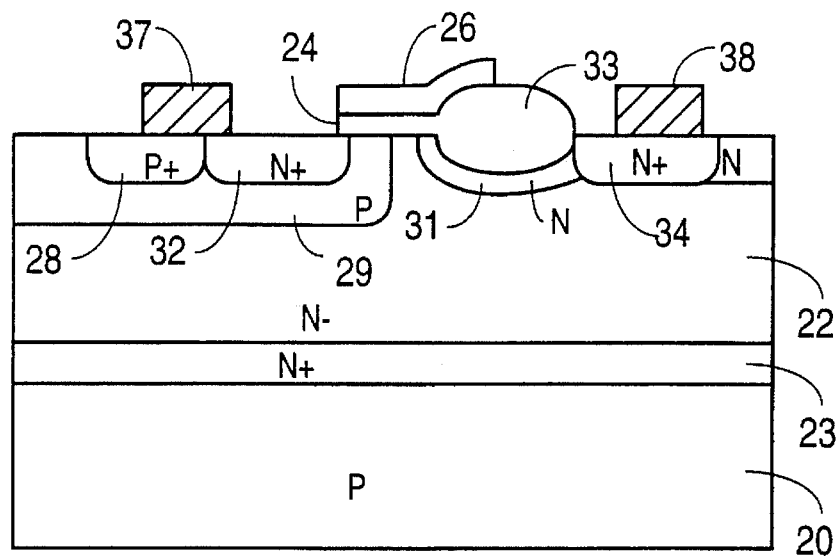
FIG. 4 is a cross-sectional view of an LDMOS transistor incorporating a field oxide portion and an enhanced drift region in accordance with another embodiment of the invention.
Figure 5:
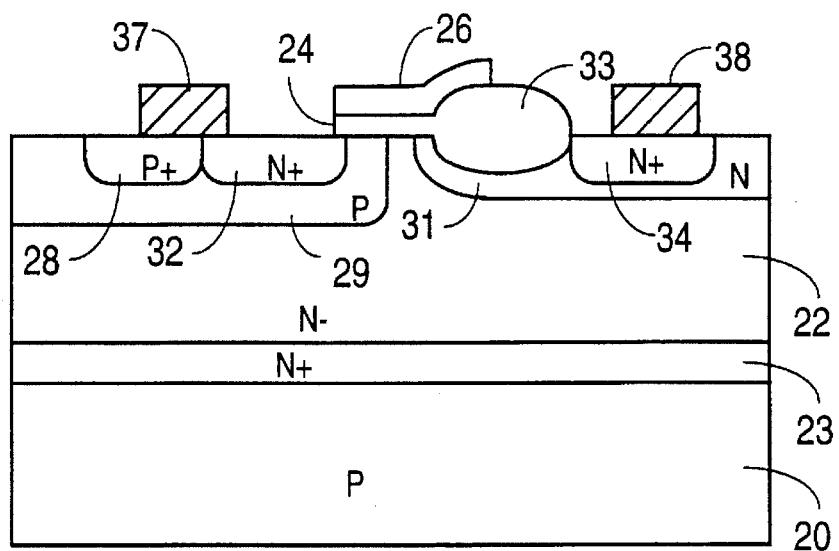
FIG. 5 is a cross-sectional view of an LDMOS transistor incorporating a field oxide region and an alternative enhanced drift region in accordance with another embodiment of the invention.

In another configuration, the N⁺ drain region 34 may be formed within the N enhanced drift region 31, as shown in FIG. 3, if region 31 is made deeper. Furthermore, the gate oxide 24 under the drain side of gate 26 may include a field oxide region 33 (FIGS. 4 and 5) to reduce the Miller capacitance of the transistor and increase the breakdown voltage between the gate 26 and drain region 34.

The N-channel DMOS transistors shown in FIGS. 2–5 can be made P-channel devices by changing the conductivity types of the substrate, epitaxial layer, and other regions. Additionally, a P-channel DMOS device may be formed in a P-well, where the P-well is formed within the N⁻ epitaxial layer 22 or within an N⁺ substrate. The enhanced drift region 31 may even be used in a non-DMOS transistor by the elimination of body 29 in FIGS. 2–5. Conventional techniques may be used to form all regions, with the parameters of the various regions being adjusted for the intended application of the transistor.

In tests performed on transistors incorporating the N enhanced drift region 31, the $R_{on}$ X Area product (milliohms-cm²) was around 0.95 for a $V_{GS}$ of 12 volts. The breakdown voltage of the device began at 25 volts. Devices having a breakdown voltage of 60 volts have also been built and tested with surprisingly good $R_{on}$ X Area results. Generally, by using the enhanced drift regions, the $R_{on}$ X Area is 20–30% better without any significant decrease in breakdown voltage.

The breakdown voltage of the device is dependent upon the spacing between the drain and the gate and the total charge in the drift region. For a 100 cell device having an area of approximately 50,000 microns², a drift region dosage of 8E13 ions/cm², and an N⁺ drain-to-gate separation of 1.5 microns, the $R_{on}$ ($V_{GS}$=12 volts) was 1.73 ohms and the breakdown voltage was 25 volts. A larger N⁺ drain-to-gate separation did not signficantly increase the breakdown voltage.

Figure 6:
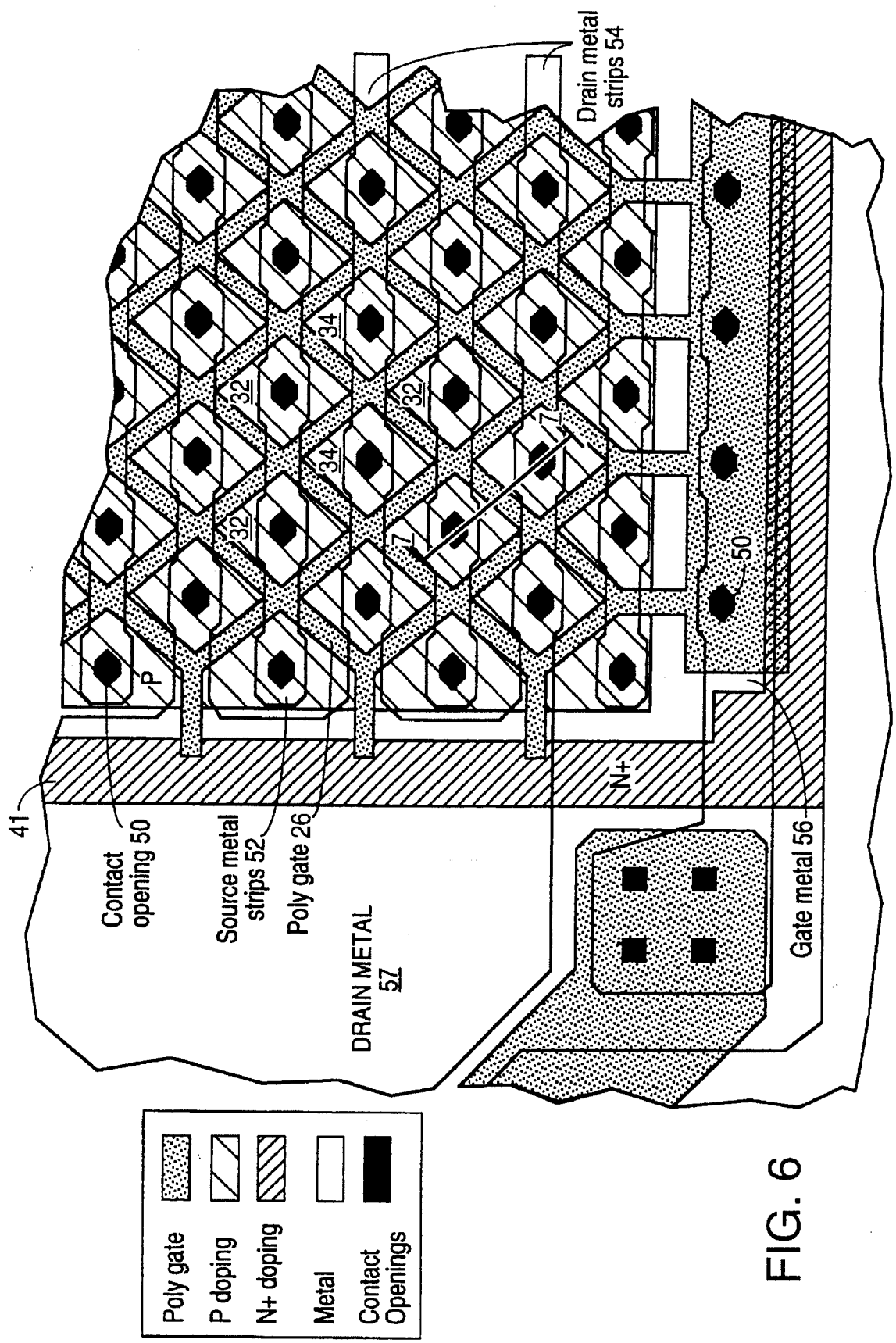
FIG. 6 is a top view of a cellular transistor having a mesh gate and diamond shaped source and drain regions in accordance with one embodiment of the invention.

FIG. 6 illustrates the various regions and layers of a cellular array embodiment of the transistor. A cross-section of a single transistor in the array may generally resemble any of the structures of FIGS. 2–5. The mesh gate pattern in FIG. 6 results in a dense array of cellular source and drain regions, while enabling the source metal strips and drain metal strips to be wider to thus reduce their resistance and lower the on-resistance of the transistor without sacrificing area. Additionally, the cellular configuration minimizes the source and drain area lost where the metal strips make contact to the source and drain regions.

In an actual top view of the transistor, the metal portions would obscure any underlying portions. In FIG. 6, the metal portions are made transparent to better illustrate the preferred transistor structure. The masks used to form the novel transistor may be derived from the representation of FIG. 6.

A complete transistor array is not shown for simplicity. The remainder of the transistor would be substantially identical to the portion shown in FIG. 6 but with a source metal plate (instead of a drain metal plate) connecting together the various source metal strips (to be described later). The size of the transistor array can be selected to achieve virtually any on-resistance and current handling capacity.

The transistor of FIG. 6 will be described in conjunction with FIG. 7, which is a cross-sectional view of a portion of the transistor taken along line 7—7 in FIG. 6. Elements in FIGS. 6, 7, and 2 identified with the same numerals are essentially identical and will not be described again in detail.

The starting substrate in one embodiment is a P-type silicon substrate 20. An N⁻ epitaxial layer 22 is then grown on the surface of the substrate 20 using conventional techniques.

A thin layer of gate oxide 24 is then grown on the surface of the N⁻ epitaxial layer 22. A layer of polysilicon is then deposited on the surface of the gate oxide 24 and defined to produce the polysilicon gate 26.

As shown in FIG. 6, the gate 26 is formed to resemble a mesh having diamond shaped openings. However, the transistor can also be formed with openings of different shapes, such as, hexagons, circles, triangles, squares etc. In one embodiment of the invention using diamond shaped openings, each of the diamond shaped openings has inner angles 78° and 102°, where the opposing 78° angles intersect the long diagonal of the diamond and the opposing 102° angles intersect the short diagonal. In other embodiments using diamond shaped openings, the acute internal angles may range from approximately 45° to 85° and the obtuse angles may range from approximately 135° to 95°.

An $N^+$ ring 41 (FIG. 6) may also be used to form a guard ring (channel stop) around the periphery of the transistor array.

Well known gate edge spacers may be formed, if desired, prior to the P doping process to prevent the P doping from subsequently diffusing too far under the gate 26. P-type dopants are then implanted to form the body regions 29 and then driven in.

An N dopant implant is then used to form the N enhanced drift regions 31 to substantially reduce on-resistance. Conventional N and P doping processes are then used to form the $N^+$ source regions 32, the $N^+$ drain regions 34, and the $P^+$ body contact regions 28.

An optional salicide/polycide step as previously described may be used to reduce the resistivity at the surface of the polysilicon gate 26 and the various source 32 and drain 34 regions.

Next, an insulating layer (approximately one micron thick) of oxide 47 is deposited over the surface of the wafer. This layer of oxide 47 is then patterned and etched to form the various contact openings 50 in the oxide 47. These contact openings 50 are shown in FIG. 6 as black spots. Two such contact openings 50 are shown in FIG. 7 extending down to the source 32 and drain 34 regions.

Next, a metal layer, such as a conventional aluminum or aluminum alloy layer, is deposited on the surface of the wafer using well known techniques. The metal layer is then patterned and etched using conventional photolithographic and etching techniques to form source metal strips 52 and drain metal strips 54 which overlie and contact the various source regions 32 and drain regions 34, respectively.

The metal layer defining step also forms a gate metal strip 56 (FIG. 6), which makes contact to the polysilicon gate 26 via the contact openings 50. A similar gate metal strip (not shown) makes contact to the other end of gate 26.

The drain metal strips 54 terminate in a large drain metal plate 57 (FIG. 6) which is connected to a drain voltage supply. Similarly, on the opposite side of the transistor (not shown), a source metal plate connects all the source metal strips 52 together and is connected to a source voltage supply. The source metal plate and connections to the source metal strips 52 may be essentially a mirror image of the drain metal plate 57 and its connections to the drain metal strips 54.

The gate metal strip 56 is connected via either a metal extension or polysilicon extension to a gate voltage supply (not shown).

Figure 7:
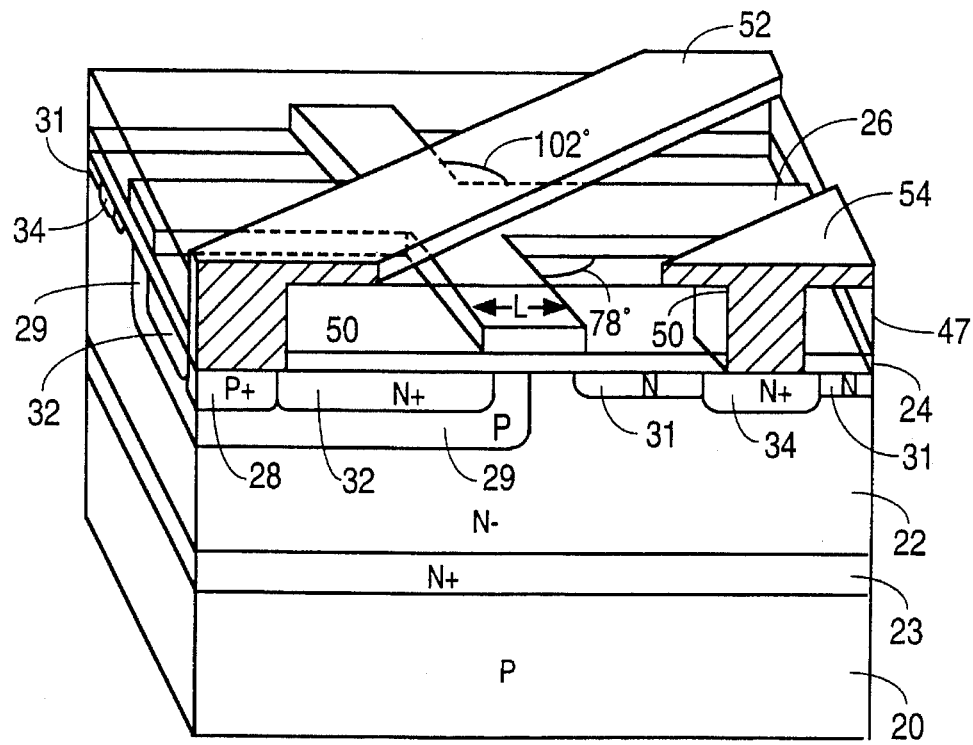
FIG. 7 is a perspective view in cross-section of a portion of the transistor structure of FIG. 6 taken along line 7—7, showing an enhanced drift region.

In the embodiment shown in FIGS. 6 and 7, the length L of gate 26 is approximately 3 microns, and the long diagonal and short diagonal of the various source 32 and drain 34 regions are approximately 16.5 microns and 13.5 microns, respectively. These lengths may be modified depending upon the required operating conditions (e.g., voltage levels) of the device. The widths of the source and drain metal strips 52 and 54 are approximately 5 microns.

It can be appreciated that as the diamond shaped openings formed by gate 26 become more elongated by increasing the long diagonal of the openings and decreasing the short diagonal, the separation between the centers of adjacent source 32 and drain 34 regions is increased while the separation between the centers of adjacent source 32 regions in a single source row or between the centers of adjacent drain 34 regions in a single drain row is decreased. The overall gate width and the area of the transistor, however, remain substantially unchanged. By increasing the separation between adjacent source 32 and drain 34 regions, the width of the source metal strips 52 and drain metal strips 54 may be increased. This widening of the strips reduces the resistance of the strips but does not increase the area required for the transistor. Thus, the on-resistance of the transistor is decreased without sacrificing any area.

Additionally, as the separation between adjacent source regions 32 in a source row and adjacent drain regions 34 in a drain row is decreased, the required length of the source metal strips 52 and drain metal strips 54 decreases, further reducing the on-resistance caused by the inherent resistivity of the metal strips.

Also, since the gate 26 surrounds each of the contact openings 50, only one central contact per diamond-shaped region is needed to properly bias each source and drain region. The surface area of the source and drain regions is efficiently utilized since the regions are substantially uniformly biased along the gate due to the central metal contact.

Generally, it is much easier to pattern the polysilicon gate to have angles of 45° and multiples thereof. Therefore, the gate structure of FIG. 8 may be more desirable than that of FIG. 6, since the diamond shaped openings in FIG. 6 have been replaced by propeller shaped patterns whose internal angles are multiples of 45°.

Figure 8:
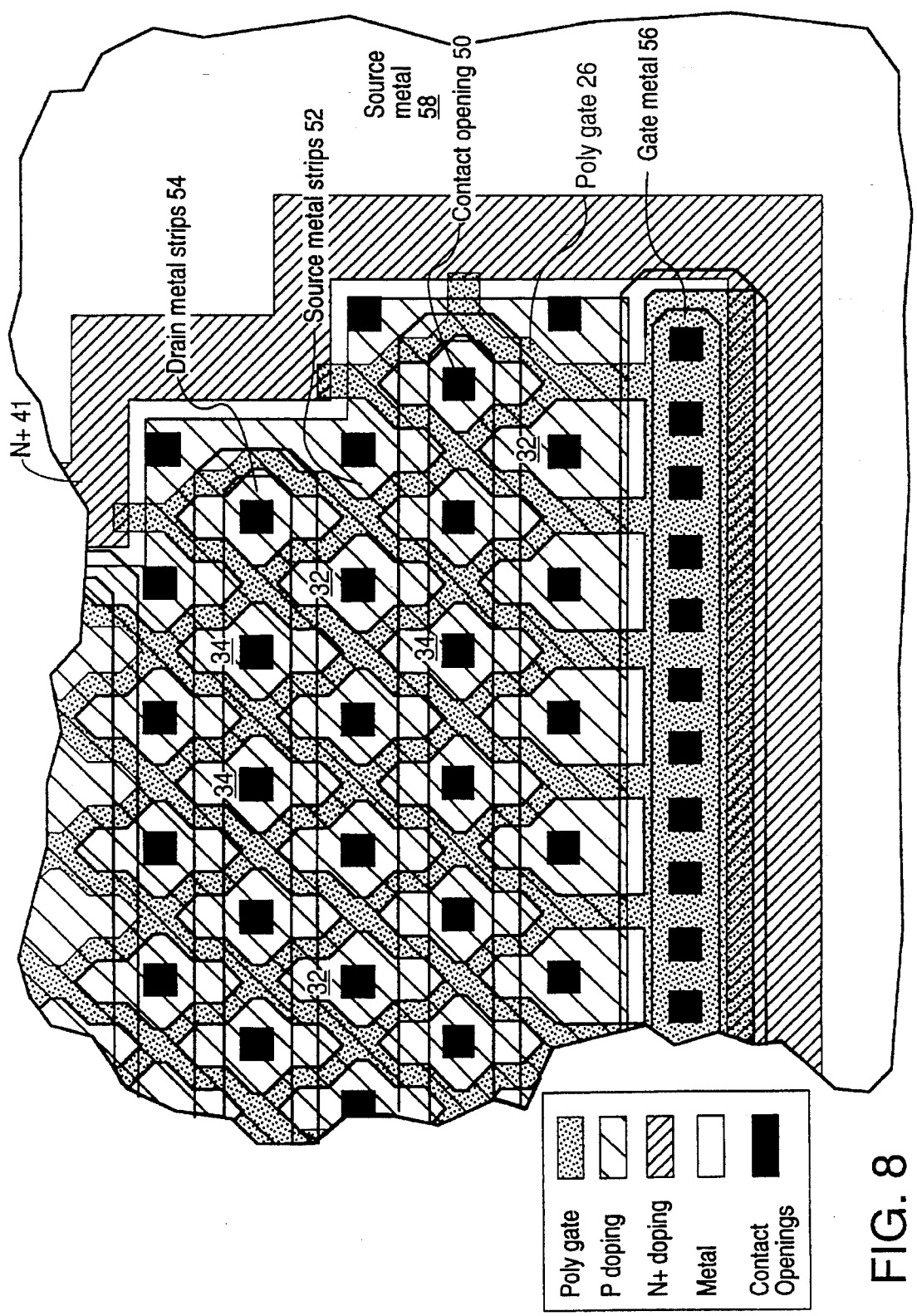
FIG. 8 is a top view of a cellular transistor similar to that of FIG. 6 but having propeller shaped source and drain regions in accordance with another embodiment of the invention.

The various patterned layers and regions represented by FIG. 8 are labelled with the same numbers as in FIG. 6 since this structure is essentially identical to the structure of FIG. 6 except for the pattern of polysilicon gate 26. The portion of the transistor illustrated in FIG. 8 shows the source metal plate 58 on the right side of the structure shorting together the source metal strips 52. The structure of FIG. 6 would have a similar source metal plate 58 shorting together the source metal strips 52 in FIG. 6. A drain metal plate (not shown) is formed on the left end of the transistor structure of FIG. 8 identical to that shown in FIG. 6.

The method for forming the structure illustrated by FIG. 8 is identical to that described with respect to FIGS. 6 and 7, and the resulting structure will be similar to that shown in FIG. 7 but with openings formed by gate 26 having a propeller shape rather than a diamond shape pattern.

In the embodiment of the transistor of FIG. 8, the length of the gate 26 is approximately 2.75 microns, the long diagonal openings are approximately 18.25 microns, and the short diagonal openings are approximately 10.25 microns. The contact openings 50 are approximately 3. microns across. The widths of the source metal strips 52 and drain metal strips 54 are approximately 7.5 microns.

In the embodiments of FIGS. 6–8, although increasing the long diagonal of the diamond shaped openings (or roughly diamond shaped openings in FIG. 8) allows the metal strips 52 and 54 to be made desirably wider, the resistance between the central metal contact and the far edges of a source 32 region undesirably increases. This increases the voltage drop along the region and lowers the overall gain of the transistor. Forming a silicide on the surface of the source 32 regions greatly decreases this resistance. Still, for a particular source/drain doping level and device size (among other considerations), there will be an optimum diamond opening shape which will provide the lowest $R_{on}$ X Area product.

Figure 9:
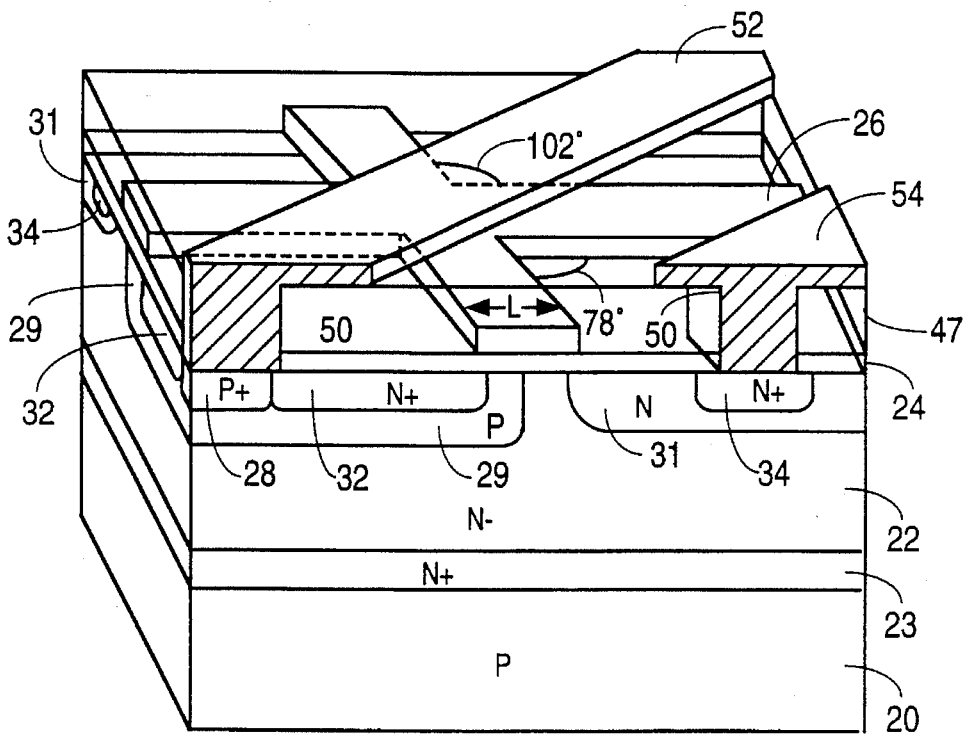
FIG. 9 is a perspective view in cross-section of a portion of an alternative transistor structure of FIG. 6, taken along line 7—7, showing an alternative enhanced drift region.

FIG. 9 illustrates another embodiment using the cellular structure in which the drain regions 34 are formed within the enhanced drift regions 31.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lateral DMOS transistor structure comprising:
   a semiconductor material of a first conductivity type, said semiconductor material having a first dopant concentration and a top surface;
   a conductive gate overlying and insulated from said top surface of said semiconductor material;
   a first region formed completely within said semiconductor material of said first conductivity type, said first region being self-aligned with said conductive gate when forming said first region, said first region being of said first conductivity type and having a second dopant concentration to form an enhanced drift region of said DMOS transistor, wherein said second dopant concentration is greater than said first dopant concentration;
   a second region formed in said semiconductor material, said second region being of said first conductivity type and having a third dopant concentration greater than said second dopant concentration to form a drain region of said DMOS transistor, said second region contacting said first region, said second region being separated from said conductive gate by a first distance necessary to achieve a first breakdown voltage;
   a third region formed in said semiconductor material, said third region being of a second conductivity type and having a fourth dopant concentration to form a body region of said DMOS transistor, said third region having a first end underlying said conductive gate, any remaining portion of said semiconductor material underlying said gate being of said first conductivity type; and
   a fourth region formed in said semiconductor material, said fourth region being of said first conductivity type and having said third dopant concentration to form a source region of said DMOS transistor, said fourth region being located within said third region,
   wherein said first region acts to reduce an ON-resistance of said DMOS transistor as compared to said DMOS transistor lacking said first region.

2. The structure of claim 1 further comprising:
   a fifth region formed within said third region, said fifth region being of said second conductivity type and having a fifth dopant concentration greater than said fourth dopant concentration.

3. The structure of claim 1 wherein said second region is located within said first region.

4. The structure of claim 1 wherein said first conductivity type is an N type.

5. The structure of claim 1 wherein said semiconductor material is an epitaxial layer.

6. The structure of claim 1 wherein said semiconductor material is a well region of said first conductivity type.

7. The structure of claim 1 wherein said transistor is interconnected with other components in an integrated circuit.

8. The structure of claim 1 wherein said transistor is formed as a discrete component.

9. The structure of claim 1 wherein said DMOS transistor is formed as a cellular structure, wherein:
   said conductive gate comprises a mesh having a plurality of substantially identical openings;
   said first region is one of a plurality of substantially identical enhanced drift regions of said DMOS transistor;
   said second region is one of a plurality of substantially identical drain regions of said DMOS transistor, each of said drain regions contacting a respective one of said enhanced drift regions, each of said drain regions being separated from said conductive gate by said first distance, and each of said drain regions underlying one of said openings in said mesh;
   said third region is one of a plurality of substantially identical body regions of said DMOS transistor, each of said body regions having a first end underlying said conductive gate;
   said fourth region is one of a plurality of substantially identical source regions of said DMOS transistor, each of said source regions being located within a respective one of said body regions, each of said of source regions underlying one of said openings in said mesh;
   a first conductive strip of material overlying and electrically contacting central portions of a first row of said source regions, said first conductive strip for being connected to a source voltage; and
   a second conductive strip of material overlying and electrically contacting central portions of a second row of drain regions adjacent to said first row of said source regions,
   wherein said plurality of substantially identical enhanced drift regions acts to reduce an ON-resistance of said DMOS transistor as compared to a DMOS transistor lacking said plurality of substantially identical enhanced drift regions.

10. The structure of claim 9 wherein each of said openings in said mesh approximates an elongated diamond shape having a long diagonal and a short diagonal.

11. The structure of claim 10 wherein a ratio of said long diagonal to said short diagonal is equal to or greater than approximately 1.2.

12. The structure of claim 10 wherein a ratio of said long diagonal to said short diagonal is equal to or greater than approximately 1.5.

13. The structure of claim 10 wherein each of said openings is a parallelogram having two internal angles within the range of approximately 45° to 85° and two internal angles within the range of approximately 135° to 95°.

14. The structure of claim 9 further comprising:
   a plurality of fifth regions, each formed within a respective one of said body regions, said fifth regions being of said second conductivity type and having a fifth dopant concentration greater than said fourth dopant concentration.

15. The structure of claim 9 wherein each of said drain regions is located within one of said enhanced drift regions.

16. The structure of claim 9 wherein each of said openings is formed to have internal angles being multiples of 45° so as to approximate a diamond shape.

17. The structure of claim 9 wherein said transistor is interconnected with other components in an integrated circuit.

18. The transistor of claim 9 wherein said transistor is formed as a discrete component.

19. A DMOS transistor formed as a cellular structure comprising:

- a semiconductor material of a first conductivity type and a first dopant concentration, said semiconductor material having a top surface;
- a conductive gate overlying and insulated from said top surface of said semiconductor material, said conductive gate forming a mesh having a plurality of substantially identical openings, each of said openings approximating an elongated diamond shape having a long diagonal and a short diagonal;
- a plurality of first regions of said semiconductor material, said first regions being of said first conductivity type and a second dopant concentration to form substantially identical enhanced drift regions of said DMOS transistor, wherein said second dopant concentration is greater than said first dopant concentration;
- a plurality of second regions of said semiconductor material, said second regions being of said first conductivity type and a third dopant concentration greater than said second dopant concentration to form substantially identical drain regions of said DMOS transistor, wherein each of said second regions contacts a respective one of said first regions, wherein each of said second regions is separated from said conductive gate by a first distance necessary to achieve a first breakdown voltage, and wherein each of said second regions underlies one of said openings in said mesh;
- a plurality of third regions of said semiconductor material, said third regions being of a second conductivity type and a fourth dopant concentration to form substantially identical body regions of said DMOS transistor, each of said third regions having a first end, wherein said first end of each of said third regions underlies said conductive gate;
- a plurality of fourth regions of said semiconductor material, each of said fourth regions being of said first conductivity type and of said third dopant concentration to form substantially identical source regions of said DMOS transistor, each of said fourth regions located within a respective one of said third regions, and wherein each of said fourth regions underlies one of said openings in said mesh;
- a first conductive strip of material overlying and electrically contacting central portions of a first row of said source regions, said first conductive strip for being connected to a source voltage; and
- a second conductive strip of material overlying and electrically contacting central portions of a second row of drain regions adjacent to said first row of said source regions,
- wherein said first regions act to reduce an ON-resistance of said DMOS transistor as compared to a DMOS transistor lacking said first region.

20. The DMOS transistor of claim 19 wherein each of said openings in said gate is formed to have internal angles being multiples of 45° so as to approximate a diamond shape.

\* \* \* \* \*